(12) United States Patent
Kawai

(10) Patent No.: US 8,907,548 B2
(45) Date of Patent: Dec. 9, 2014

(54) RESONATOR ELEMENT HAVING A MASS PORTION

(75) Inventor: Hiroki Kawai, Chino (JP)

(73) Assignee: Seiko Epson Corporation (JP)

( * ) Notice: Subject to any disclaimer, the term of this patent is extended or adjusted under 35 U.S.C. 154(b) by 579 days.

(21) Appl. No.: 12/976,192

(22) Filed: Dec. 22, 2010

(65) Prior Publication Data

US 2011/0156827 A1 Jun. 30, 2011

(30) Foreign Application Priority Data

Dec. 29, 2009 (JP) ................................. 2009-299050
Aug. 11, 2010 (JP) ................................. 2010-180101

(51) Int. Cl.
*H03H 9/21* (2006.01)
*H03H 9/10* (2006.01)
*H03H 9/05* (2006.01)
*H03H 3/04* (2006.01)

(52) U.S. Cl.
CPC ............... *H03H 9/21* (2013.01); *H03H 9/1021* (2013.01); *H03H 2003/0492* (2013.01); *H03H 9/0547* (2013.01)
USPC ............................ 310/370; 333/200; 331/156

(58) Field of Classification Search
USPC ......................................................... 310/370
See application file for complete search history.

(56) References Cited

U.S. PATENT DOCUMENTS

| | | | |
|---|---|---|---|
| 3,969,641 A * | 7/1976 | Oguchi et al. | 310/348 |
| 4,377,765 A * | 3/1983 | Kogure et al. | 310/312 |
| 4,498,025 A | 2/1985 | Takahashi | |
| 4,771,202 A | 9/1988 | Takahashi | |
| 5,918,354 A * | 7/1999 | Ikegami et al. | 29/25.35 |
| 6,545,392 B2 * | 4/2003 | Kawauchi et al. | 310/344 |
| 6,768,247 B2 * | 7/2004 | Kitamura et al. | 310/370 |
| 6,864,619 B2 * | 3/2005 | Aigner et al. | 310/321 |
| 6,924,582 B2 * | 8/2005 | Shimizu et al. | 310/312 |

(Continued)

FOREIGN PATENT DOCUMENTS

| | | | | |
|---|---|---|---|---|
| CN | 101335507 A | 12/2008 | | |
| JP | 54065496 A * | 5/1979 | ............... | H03H 9/02 |

(Continued)

OTHER PUBLICATIONS

Extended European Search Report for Application No. 10 19 6457 mailed Sep. 6, 2012 (6 pages).

(Continued)

*Primary Examiner* — J. San Martin
(74) *Attorney, Agent, or Firm* — Harness, Dickey & Pierce, P.L.C.

(57) ABSTRACT

A resonator element includes: a base portion provided on a plane including a first axis and a second axis orthogonal to the first axis; a vibrating arm extending from the base portion in the first axis direction; an excitation electrode provided on the vibrating arm so as to excite the vibrating arm; and a first mass portion provided on the vibrating arm so as to adjust the frequency of the vibrating arm, wherein the vibrating arm performs flexural vibration in a direction perpendicular to the plane and wherein the first mass portion is provided in a region exceeding ½ of the entire length in the first axis direction of the vibrating arm from the end of the vibrating arm close to the base portion and is formed from a material whose density D (in units of $10^3$ kg/m$^3$) is in the range of $2.20 \leq D \leq 8.92$.

19 Claims, 7 Drawing Sheets

(56) References Cited

U.S. PATENT DOCUMENTS

| | | | |
|---|---|---|---|
| 7,337,667 B2 | 3/2008 | Ohuchi et al. | |
| 7,368,861 B2 | 5/2008 | Tanaya | |
| 7,397,172 B2 | 7/2008 | Kikushima | |
| 7,441,459 B2 | 10/2008 | Ohuchi et al. | |
| 7,592,741 B2 * | 9/2009 | Tanaya et al. | 310/370 |
| 7,631,412 B2 * | 12/2009 | Barber et al. | 29/594 |
| 7,759,848 B2 | 7/2010 | Hirasawa | |
| 7,764,145 B2 * | 7/2010 | Iwai | 333/200 |
| 7,948,157 B2 * | 5/2011 | Iwatate et al. | 310/370 |
| 7,984,157 B2 | 7/2011 | Panasyuk et al. | |
| 8,098,002 B2 | 1/2012 | Baborowski et al. | |
| 8,201,450 B2 | 6/2012 | Ohuchi et al. | |
| 8,314,666 B2 | 11/2012 | Huang et al. | |
| 8,390,389 B2 | 3/2013 | Kawai | |
| 8,446,079 B2 | 5/2013 | Fang et al. | |
| 2008/0129415 A1 | 6/2008 | Iwai | |
| 2009/0001856 A1 | 1/2009 | Hara et al. | |
| 2009/0015106 A1 * | 1/2009 | Tanaya | 310/344 |
| 2010/0156237 A1 * | 6/2010 | Ichikawa et al. | 310/312 |
| 2011/0156827 A1 | 6/2011 | Kawai | |
| 2011/0227450 A1 | 9/2011 | Yamazaki | |

FOREIGN PATENT DOCUMENTS

| | | | | |
|---|---|---|---|---|
| JP | 63262911 A * | 10/1988 | | H03H 9/02 |
| JP | 02-233009 | 9/1990 | | |
| JP | 07212161 A * | 8/1995 | | H03H 3/02 |
| JP | 2001-196882 | 7/2001 | | |
| JP | 2001-196891 A | 7/2001 | | |
| JP | 2002164759 A * | 6/2002 | | H03H 3/04 |
| JP | 2003-133885 A | 5/2003 | | |
| JP | 2003-318685 | 11/2003 | | |
| JP | 2006-262456 A | 9/2006 | | |
| JP | 2006262456 A * | 9/2006 | | |
| JP | 2009-5022 | 1/2009 | | |
| JP | 2009-290778 A | 12/2009 | | |

OTHER PUBLICATIONS

Extended European Search Report for Application No. 10 196 457 mailed Sep. 6, 2012 (6 pages).

* cited by examiner

RESONATOR ELEMENT HAVING A MASS PORTION

BACKGROUND

1. Technical Field

The present invention relates to a resonator element, a resonator, an oscillator, an electronic device, and a frequency adjustment method.

2. Related Art

In a resonator having a vibrating arm, a resonator element is known in which a vibrating arm vibrates in the thickness direction of the vibrating arm (such a mode of vibration is an out-of-plane mode) rather than vibrating in an in-plane mode. This resonator element generally has an odd number of vibrating arms. When the resonator element has three or more vibrating arms, adjacent vibrating arms perform walk-mode vibration in which they repeatedly vibrate alternately in opposing directions.

Adjustment of the frequency of a tuning-fork type resonator that vibrates in an in-plane mode is performed by providing a weight on a plane in the vibration direction of the tip end of a vibrating arm and irradiating the weight with laser light or the like to remove a part of the weight. This method performs frequency adjustment by removing a part of the weight to decrease the weight of the vibrating arm, thus sequentially increasing the frequency (see JP-A-2003-318685, for example).

In contrast, the frequency of a resonator that vibrates in an out-of-plane mode is proportional to the thickness in the vibration direction of a vibrating arm and is inversely proportional to the square of the length of the vibrating arm. Therefore, adjustment of the frequency is performed by adding a weight to the side surfaces of a vibrating arm rather than adding the weight to the surfaces defining the thickness of the vibrating arm and irradiating the weight with laser light to remove apart of the weight on the side surfaces.

When a resonator vibrating in an out-of-plane mode is miniaturized, since the length of the vibrating arm decreases, it is necessary to make the vibrating arm thinner in order to obtain the same frequency.

However, it is difficult to add a weight on side surfaces of a thin vibrating arm to perform frequency adjustment of a resonator element. Moreover, even when the weight can be added to the side surfaces of the vibrating arm, it is very difficult to irradiate the side surfaces with laser light to remove a part of the weight. It is desirable that frequency adjustment of a resonator that vibrates in the out-of-plane mode is performed easily and with high accuracy.

In a resonator element that vibrates in the out-of-plane mode, similarly to a resonator element that vibrates in the in-plane mode of the tuning-fork type, when performing frequency adjustment by adding or removing a film in the thickness direction of the vibrating arm, it is necessary to consider changes in the thickness as well as just a weight effect. For this reason, it was considered difficult to perform the frequency adjustment by adding or removing a film in the thickness direction of the vibrating arm in a resonator that vibrates in the out-of-plane mode.

The present inventor has made an observation using a resonator element that vibrates in the out-of-plane mode and has one vibrating arm on a base portion thereof as a model and performed a simulation on the changes in frequency when a gold (Au) film is formed on one surface of the vibrating arm and removed from the tip end side of the vibrating arm.

According to the observation, when a mass portion such as a metal film or an insulating film formed on the vibrating arm is removed from the tip end side thereof, the frequency sequentially increases, and the frequency change becomes zero at approximately the central portion of the vibrating arm. When the mass portion such as the metal film or the insulating film is further removed towards the base portion, the frequency sequentially decreases.

Given the above, the present inventor has discovered a fact that the boundary at which the direction of the change in the frequency changes is present approximately near the center in the longitudinal direction of the vibrating arm and has concluded that the frequency of the resonator can be adjusted using this phenomenon. Particularly, near the center of the vibrating arm, the changes in frequency with the removal of the mass portion such as the metal film or the insulating film are small, and high-accuracy frequency adjustment can be expected.

However, it is necessary to form an excitation electrode in the vibrating arm so as to extend from the base portion to a length of about ½ of the length of the vibrating arm in order to excite the vibrating arm. This is because unless the excitation electrode is formed to a length of about at least ½ of the vibrating arm, the excitation efficiency deteriorates and the CI value increases. Thus, it is difficult to obtain favorable vibration properties in the resonator element.

For this reason, when a mass portion is provided closer to the tip end side than the half-length portion of the resonator element, a variation of the frequencies increases with the removal of the metal film or the insulating film, and fine tuning thereof is difficult. Thus, there is a problem in that it is not possible to adjust the frequencies with high accuracy.

Moreover, the mass portion can be provided near the center in the longitudinal direction of the vibrating arm by forming the mass portion on a surface opposite the excitation electrode, and fine tuning of the frequencies is possible. However, in this case, since the metal film or the insulating film is removed, for example, by irradiating it with laser light, the mass portion may cause damage to the excitation electrode on the rear surface. Moreover, if the excitation electrode is damaged, the vibration properties of the resonator element deteriorate.

Given the above, it is desirable to have a resonator element which enables high-accuracy frequency adjustment without deteriorating the vibration properties of the resonator element.

SUMMARY

An advantage of some aspects of the invention is to solve at least a part of the above-described problems and the invention can be embodied as the following forms or application examples.

Application Example 1

According to this application example of the invention, there is provided a resonator element including: a base portion provided on a plane including a first axis and a second axis orthogonal to the first axis; a vibrating arm extending from the base portion in the first axis direction; an excitation electrode provided on the vibrating arm so as to excite the vibrating arm; and a first mass portion provided on the vibrating arm so as to adjust the frequency of the vibrating arm, in which the vibrating arm performs flexural vibration in a direction perpendicular to the plane and has a first surface which contracts or expands with the flexural vibration and a second surface which expands when the first surface contracts and contracts when the first surface expands, and in which the first mass portion is provided in a region exceeding ½ of the entire length in the first axis direction of the vibrating arm from the end of the vibrating arm close to the base portion and is formed from a material whose density D (in units of $10^3$ kg/m$^3$) is in the range of $2.20 \leq D \leq 8.92$.

According to this configuration, the first mass portion of the resonator element is disposed on the tip end side of the vibrating arm while exceeding ½ of the length (entire length) of the vibrating arm from the base portion and is formed from the material whose density D (in units of $10^3$ kg/m$^3$) is in the range of $2.20 \leq D \leq 8.92$.

Thus, it is possible to secure an excitation electrode for exciting the vibrating arm of the resonator element so as to have a length of ½ of the entire length of the vibrating arm. Thus, it is possible to obtain sufficient vibration properties with a low CI value for practical oscillation.

Moreover, the density D (in units of $10^3$ kg/m$^3$) of the material formed in the first mass portion is in the range of $2.20 \leq D \leq 8.92$. Therefore, when a film is formed on the plane of the vibrating arm, the boundary at which the dominant effect of the film switches between the weight effect and the thickness effect can be formed at a position near the position exceeding ½ of the length of the vibrating arm. At this position, the variation of the frequencies is small with respect to the removal or addition of the film. Thus, the portion at this position can be used for fine tuning of the frequency adjustment, and high-accuracy frequency adjustment can be performed.

Given the above, according to the application example of the invention, it is possible to provide a resonator element which enables high-accuracy frequency adjustment while ensuring the vibration properties of the resonator element.

Application Example 2

In the resonator element of the application example, it is preferred that the first mass portion is formed from a material selected from among SiO$_2$, Al, Al$_2$O$_3$, TiO$_2$, Cr, Fe, Ni, and Cu.

Since the material used as the first mass portion has a density (in units of $10^3$ kg/m$^3$) which is in the range of $2.20 \leq D \leq 8.92$, the first mass portion can be easily formed on the vibrating arm.

Application Example 3

In the resonator element of the application example, it is preferred that a second mass portion whose density D (in units of $10^3$ kg/m$^3$) is in the range of D>8.92 is provided on the tip end of the vibrating arm.

According to this configuration, by providing a material whose density D (in units of $10^3$ kg/m$^3$) is in the range of D>8.92 on the tip end of the vibrating arm, the tip end can be used as a portion in which rough tuning of the frequency adjustment is performed. Thus, by forming a film on the tip end of the vibrating arm, it is possible to shorten the processing time of the frequency adjustment in a resonator element in which the amount of adjustment is large and whose variation of the frequencies with the removal or addition of a film is large.

Application Example 4

In the resonator element of the application example, it is preferred that the second mass portion is formed from a material selected from among Ag, Au, and Pt.

According to this configuration, since the second mass portion is formed from the material selected from among Ag, Au, and Pt, such a second mass portion can be easily formed on the vibrating arm.

Application Example 5

According to this application example of the invention, there is provided a resonator including any one of the resonator elements according to the above application examples and a package accommodating the resonator element.

According to this configuration, since the resonator includes the resonator element which enables high-accuracy frequency adjustment while providing favorable vibration properties, it is possible to provide a resonator having excellent frequency accuracy.

Application Example 6

According to this application example of the invention, there is provided an oscillator including any one of the resonator elements according to the above application examples and a circuit element connected to the resonator element.

According to this configuration, since the oscillator includes the resonator element which enables high-accuracy frequency adjustment while providing favorable vibration properties, it is possible to provide an oscillator having excellent frequency accuracy.

Application Example 7

According to this application example of the invention, there is provided an electronic device using any one of the resonator elements according to the above application examples.

According to this configuration, it is possible to provide an electronic device exhibiting the advantages of any one of the resonator elements according to the above application examples 1 to 4.

Application Example 8

According to this application example of the invention, there is provided a frequency adjustment method including: preparing a resonator element including a base portion provided on a plane including a first axis and a second axis orthogonal to the first axis, a vibrating arm extending from the base portion in the first axis direction, an excitation electrode provided on the vibrating arm so as to excite the vibrating arm, and a first mass portion provided on the vibrating arm so as to adjust the frequency of the vibrating arm, where the vibrating arm performs flexural vibration in a direction perpendicular to the plane and has a first surface which contracts or expands with the flexural vibration and a second surface which expands when the first surface contracts and contracts when the first surface expands; and adjusting the frequency of the vibrating arm by changing the mass of the first mass portion, in which the first mass portion is provided in a region exceeding ½ of the entire length in the first axis direction of the vibrating arm from the end of the vibrating arm close to the base portion and is formed from a material whose density D (in units of $10^3$ kg/m$^3$) is in the range of $2.20 \leq D \leq 8.92$.

According to this configuration, the density D (in units of $10^3$ kg/m$^3$) of the material formed in the first mass portion is in the range of $2.20 \leq D \leq 8.92$. Therefore, when a film is formed on the plane of the vibrating arm, the boundary at which the dominant effect of the film switches between the weight effect and the thickness effect can be formed at a position near the position exceeding ½ of the length of the vibrating arm. At this position, the variation of the frequencies is small with respect to the removal or addition of the film. Thus, the portion at this position can be used for fine tuning of the frequency adjustment, and high-accuracy frequency adjustment can be performed.

Application Example 9

In the frequency adjustment method, it is preferred that a second mass portion whose density D2 (in units of $10^3$ kg/m$^3$) is in the range of D2>8.92 is provided on the tip end of the vibrating arm, the method includes rough-tuning the frequency of the vibrating arm by changing the mass of the second mass portion, and the frequency is finely tuned after the rough tuning is performed.

According to this configuration, the tip end of the vibrating arm is used as the second mass portion for rough tuning which is made from a material whose density D (in units of $10^3$ kg/m$^3$) is in the range of D>8.92, and the central portion of the vibrating arm is used as the first mass portion for fine tuning which is made from a material whose density D (in units of $10^3$ kg/m$^3$) is in the range of $2.20 \leq D \leq 8.92$. Therefore, it is possible to form the excitation electrode so as to extend from the base-side end to the position near the center (½ L) of the vibrating arm. Accordingly, it is possible to prevent deterioration of the CI value.

Moreover, by finely tuning the frequency after the rough tuning is performed, the frequency adjustment of the resonator element can be performed effectively in a short period of time.

BRIEF DESCRIPTION OF THE DRAWINGS

The invention will be described with reference to the accompanying drawings, wherein like numbers reference like elements.

FIGS. 4A to 4C show a configuration of a resonator element according to a first embodiment, in which FIG. 4A is a schematic top view, FIG. 4B is a schematic sectional view taken along the line A-A in FIG. 4A, and FIG. 4C is a schematic sectional view taken along the line B-B in FIG. 4A.

FIGS. 7A and 7B show a configuration of a resonator according to a second embodiment, in which FIG. 7A is a schematic top view, and FIG. 7B is a schematic sectional view taken along the line G-G in FIG. 7A.

FIGS. 8A and 8B show a configuration of an oscillator according to a third embodiment, in which FIG. 8A is a schematic top view, and FIG. 8B is a schematic sectional view taken along the line H-H in FIG. 8A.

DESCRIPTION OF EXEMPLARY EMBODIMENTS

Prior to a description of embodiments, the relationship between a mass portion of a resonator element that vibrates in an out-of-plane mode and the frequency thereof will be described in detail.

Figure 1:
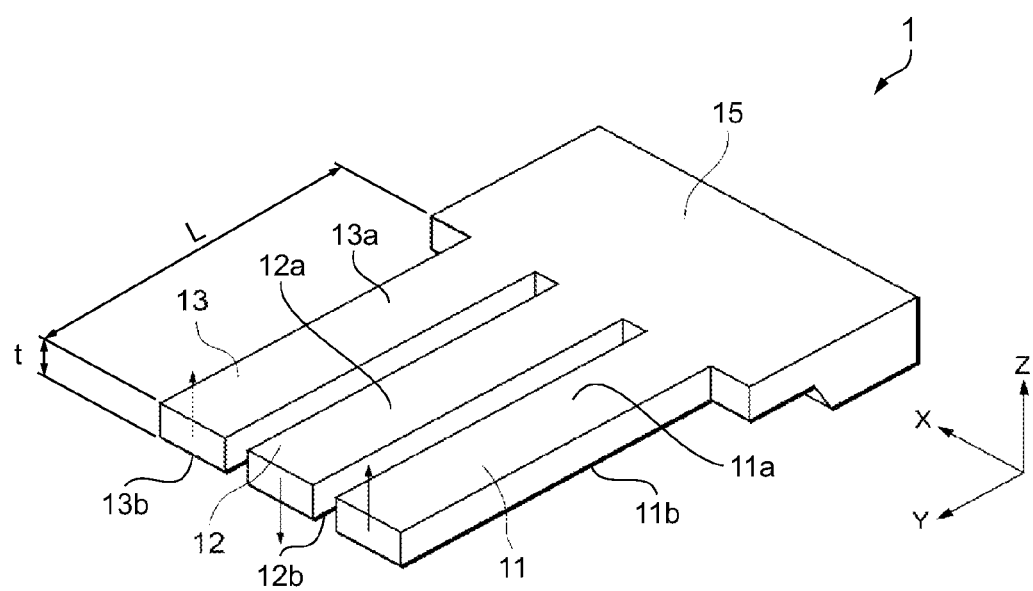
FIG. 1 is a schematic perspective view illustrating an example of a resonator element that vibrates in an out-of-plane mode.
Figure 2:
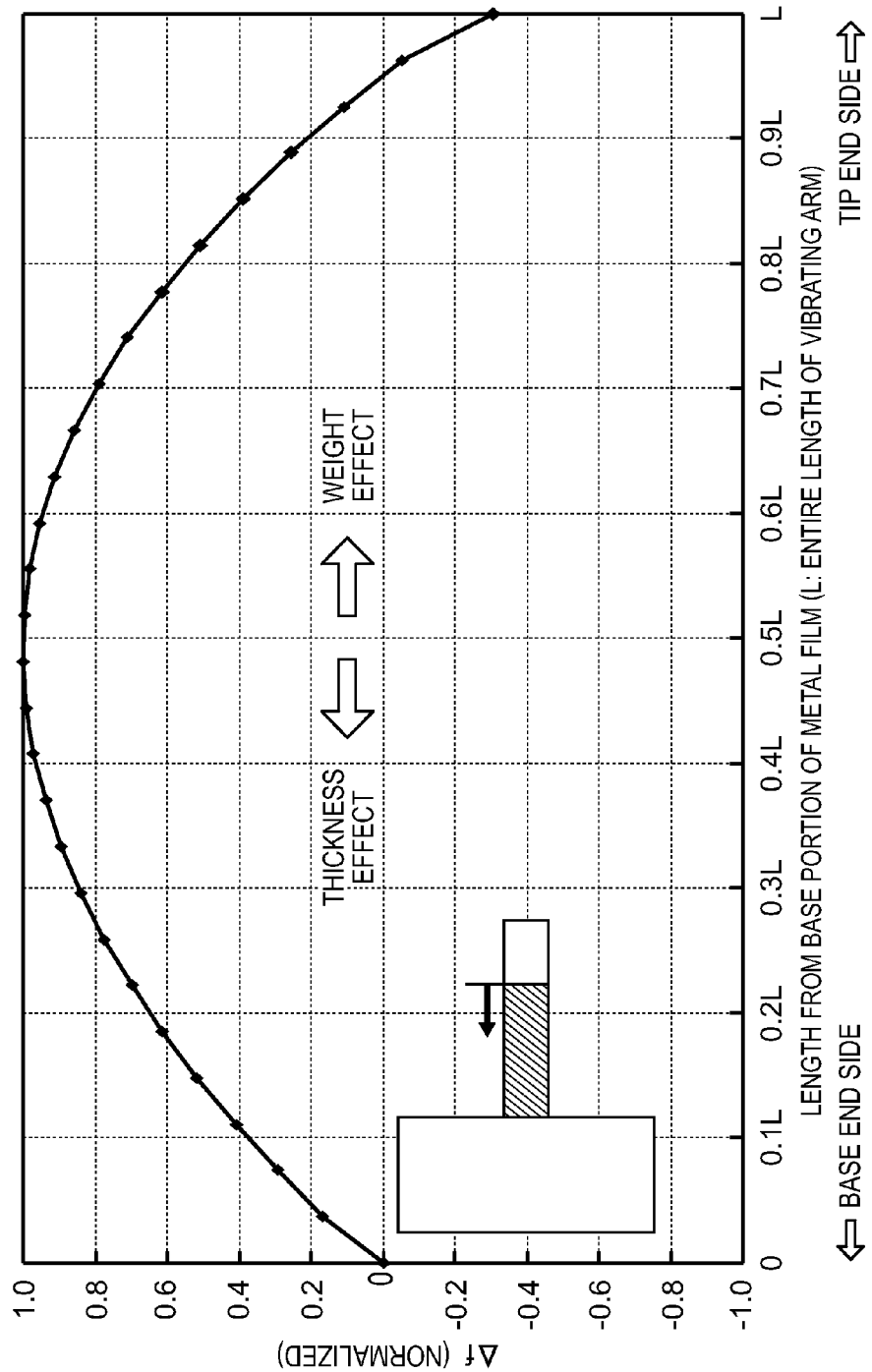
FIG. 2 is a graph showing the relationship between the formation position of a first mass portion formed on a vibrating arm and the frequency.
Figure 3:
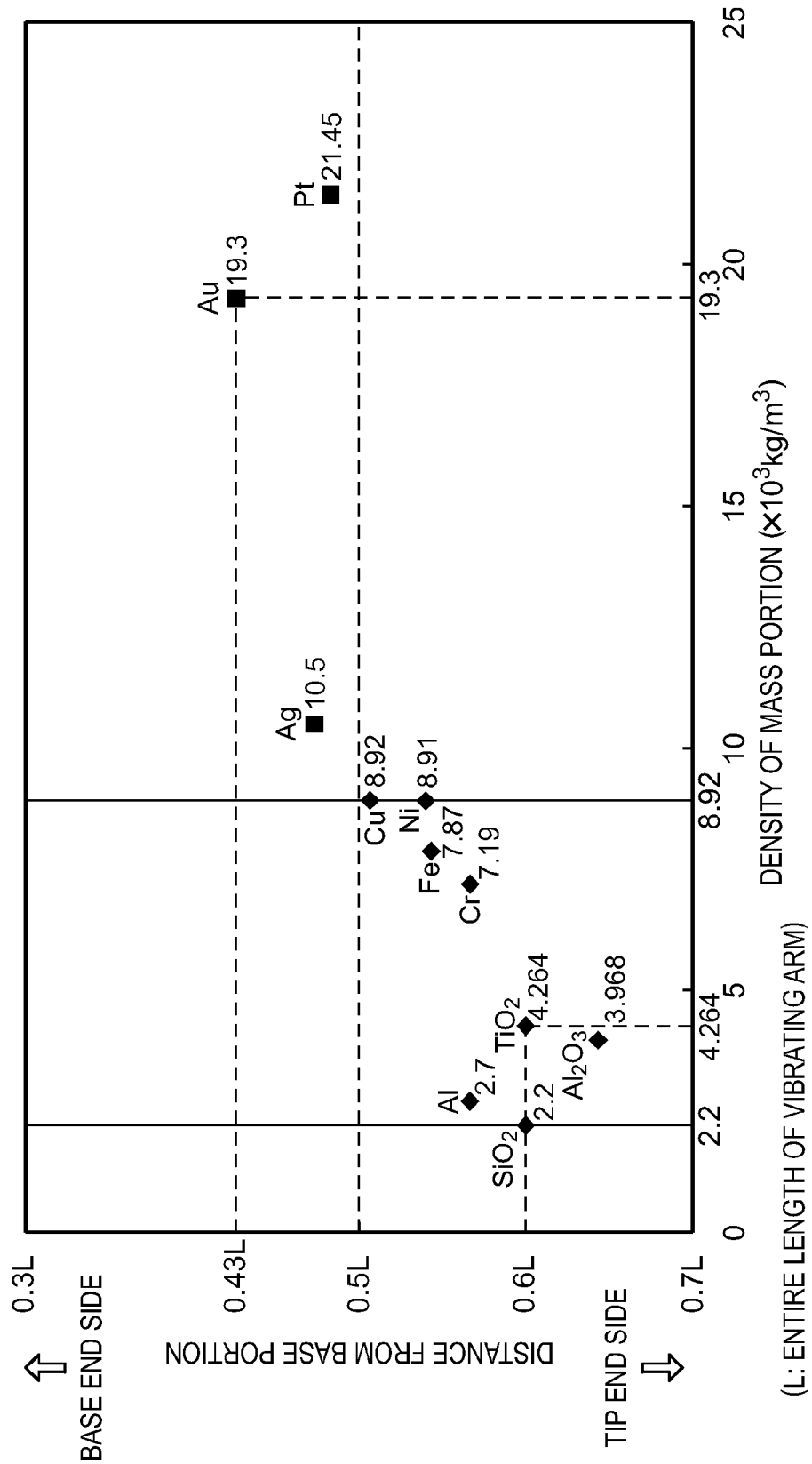
FIG. 3 is a graph showing the relationship between the density of the first mass portion formed on the vibrating arm and the boundary position at which the direction of the change in the frequency changes.

FIG. 1 is a schematic perspective view illustrating an example of a resonator element that vibrates in an out-of-plane mode. FIG. 2 is a graph showing the relationship between the formation position of a first mass portion such as a metal film or an insulating film formed on a vibrating arm and the frequency. FIG. 3 is a graph showing the relationship between the density of the first mass portion such as a metal film or an insulating film formed on the vibrating arm and the boundary position at which the frequency increases or decreases.

As shown in FIG. 1, a resonator element 1 that vibrates in an out-of-plane mode includes a base portion 15 and three vibrating arms 11, 12, and 13 extending in parallel from the base portion 15.

In the following description, when the extension direction of the vibrating arms 11, 12, and 13 is the Y direction, and a direction perpendicular to the Y direction and along which the vibrating arms 11, 12, and 13 are arranged is the X direction, a direction orthogonal to the X and Y directions is defined as the Z direction. Here, when the Y direction is defined as a first axis, and the X direction as a second axis, it can be said that the base portion 15 is formed on a plane including the first axis and the second axis orthogonal to the first axis, and the vibrating arms 11, 12, and 13 extend in the direction of the first axis.

The out-of-plane mode of vibration is a vibration mode in which the tip end of the vibrating arm vibrates in the Z direction, namely a direction orthogonal to the XY plane, and adjacent vibrating arms repeatedly vibrate in opposing directions. Such a mode of vibration is generally called an out-of-plane mode of vibration since the vibrating arms vibrate out of the XY plane on which they are formed.

Therefore, when the vibrating arms 11 and 13 vibrate in the +Z direction, and the vibrating arm 12 vibrates in the -Z direction, the opposing surfaces (specifically, first surfaces 11a, 12a, and 13a and second surfaces 11b, 12b, and 13b) of the vibrating arms 11, 12, and 13 formed on the XY plane expand or contract differently. That is, the first surfaces 11a and 13a contract, and the second surfaces 11b and 13b expand. On the other hand, the first surface 12a expands, and the second surface 12b contracts. The contraction and expansion relationship is reversed from the above when the vibrating arms 11 and 13 vibrate in the -Z direction and the vibrating arm 12 vibrates in the +Z direction.

The number of vibrating arms is not limited to three, but may be one or five.

In a resonator element that vibrates in such an out-of-plane mode, when f is the frequency of the resonator element, L is the entire length of the vibrating arm, and t is the thickness in the vibration direction of the vibrating arm, a relation of $f \propto (t/L^2)$ is satisfied.

That is, the frequency f of the resonator element that vibrates in the out-of-plane mode is proportional to the thickness t in the vibration direction of the vibrating arm and is inversely proportional to the square of the entire length L of the vibrating arm.

In the basic properties of such a resonator element 1, similarly to a resonator element that vibrates in the in-plane mode of the tuning-fork type, when performing frequency adjustment by adding or removing a film on the first or second surface of the vibrating arm disposed in the XY plane, it is necessary to consider changes in the thickness as well as just a weight effect. For this reason, it was considered to be difficult to perform the frequency adjustment by adding or removing a film on the first or second surface of the vibrating arm.

The present inventor has made an observation using a resonator element that has one vibrating arm on a base portion thereof as a model and performed a simulation on the changes in frequency when a mass portion such as a metal film or an insulating film was formed on one surface of the vibrating arm disposed in the XY plane and removed from the tip end side of the vibrating arm.

FIG. 2 is a graph showing the simulation results, in which the vertical axis represents a normalized frequency variation Δf, and the horizontal axis represents the ratio of the length from the base-side end of the metal film serving as a frequency adjustment film to the entire length L of the vibrating arm. The Δf on the horizontal axis is a value given by Δf=(f−f0)/f0 where f0 is the frequency when no metal film for frequency adjustment was formed on the vibrating arm, and f is the frequency when the metal film for frequency adjustment was formed. Further, the value Δf is normalized as Δf (normalized)=Δf/(maximum Δf) so that the maximum of Δf becomes 1. The graph shows simulation data obtained when a gold (Au) film was formed as the metal film.

According to the graph of FIG. 2, when the metal film formed on the vibrating arm is removed from the tip end side thereof, the frequency sequentially increases, and the frequency change becomes zero at approximately the central portion of the vibrating arm. When the metal film is further removed towards the base portion, the frequency sequentially decreases. Moreover, the variation of the frequency decreases towards the central portion.

With the vicinity of the center in the longitudinal direction of the vibrating arm as the boundary, the weight effect is dominant on the tip end side of the vibrating arm, and the frequency changes in an increasing direction with the removal of the metal film. Moreover, the thickness effect is dominant on the base end side of the vibrating arm from the vicinity of the center in the longitudinal direction of the vibrating arm, and the frequency changes in a decreasing direction with the removal of the metal film. That is, when the metal film is a gold film, the boundary at which the frequency changes in different directions is present approximately near the center in the longitudinal direction of the vibrating arm.

FIG. 3 shows the relationship between the boundary position and the density of the mass portion for each material. In FIG. 3, the vertical axis represents the boundary position at which the direction of the change in the frequency changes with the frequency adjustment, and the horizontal axis represents the density (in units of $10^3$ kg/m$^3$) of a metal film or an insulating film used for the mass portion. The boundary position is depicted as the ratio of the length from the base-side end of the vibrating arm to the entire length L of the vibrating arm. For example, when the value on the vertical axis is greater than 0.5 L, the boundary position is on the tip end side of the vibrating arm. On the other hand, when the value on the vertical axis is smaller than 0.5 L, the boundary position is on the base end side of the vibrating arm.

As shown in FIG. 3, the boundary position at which the direction of the change in the frequency changes is different in accordance with the density of the material of the metal film or the insulating film formed on the vibrating arm. Thus, it can be understood that the boundary position is more likely to be present on the tip end side of the vibrating arm as the density of the metal film or the insulating film decreases.

For example, when Au is used as the mass portion, the density thereof is 19.3 (in units of $10^3$ kg/m$^3$). Moreover, when the entire length of the vibrating arm is L, the boundary position is at the position of about 0.43 L from the base-side end of the vibrating arm, which is located closer to the base end side than the center of the vibrating arm. As another example, when $SiO_2$ or $TiO_2$ is used as the mass portion, the density thereof is 2.20 and 4.264 (both in units of $10^3$ kg/m$^3$) for $SiO_2$ and $TiO_2$, respectively, which are smaller than that of Au. In that case, the boundary position is at the position of 0.6 L from the base-side end of the vibrating arm, which is located closer to the tip end side than the center of the vibrating arm.

In this way, the present inventor has discovered a fact that the boundary at which the direction of the change in the frequency changes is present approximately near the center in the longitudinal direction of the vibrating arm. The present inventor has also discovered a fact that the boundary position changes with the density of the material of the mass portion such as the metal film or the insulating film, and when the density decreases, the boundary position tends to move towards the tip end side from the central portion of the vibrating arm. Based on these findings, the present inventor has created this invention.

Hereinafter, embodiments embodying the invention will be described with reference to the drawings. In the respective drawings used in the following description, the ratios of the dimensions of each element are changed appropriately in order to depict each element in a recognizable size.

First Embodiment

Figure 4A:
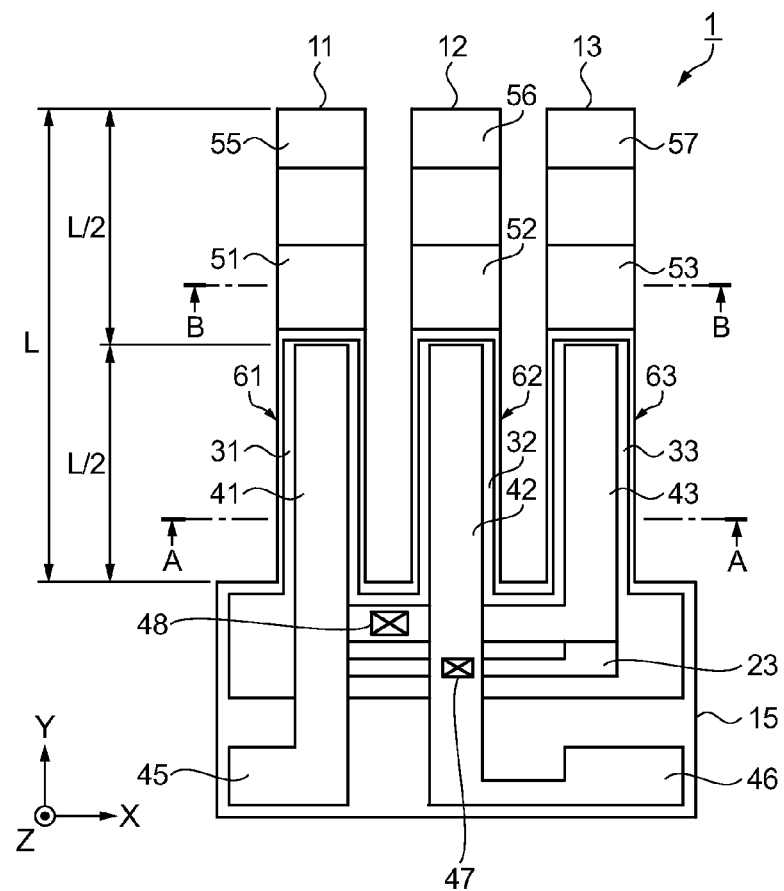
Figure 4B:
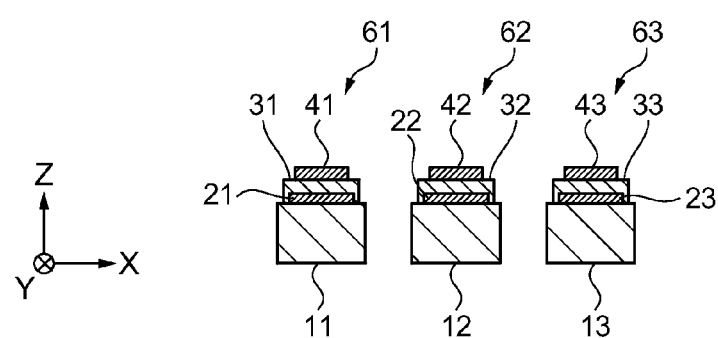
Figure 4C:
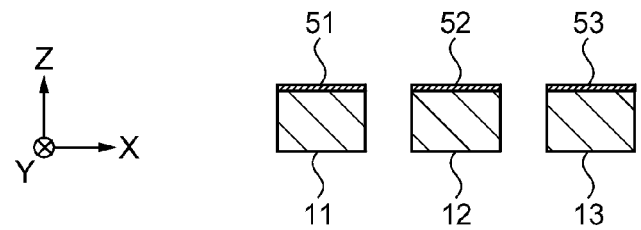

FIGS. 4A to 4C show a configuration of a resonator element according to a first embodiment, in which FIG. 4A is a schematic top view, FIG. 4B is a schematic sectional view taken along the line A-A in FIG. 4A, and FIG. 4C is a schematic sectional view taken along the line B-B in FIG. 4A.

The resonator element 1 has a shape such that the thickness direction thereof corresponds to the Z direction when it is expanded on the XY plane of an orthogonal coordinate system. The resonator element 1 includes three vibrating arms 11, 12, and 13, and the vibrating arms 11, 12, and 13 are arranged in the X direction, and each vibrating arm extends in parallel in the Y direction. The vibrating arms 11, 12, and 13 are connected to the base portion 15, thus constructing the resonator element 1 in which the respective vibrating arms 11, 12, and 13 have a cantilever structure.

Piezoelectric elements 61, 62, and 63 are formed at positions of the vibrating arms 11, 12, and 13 close to the base portion 15, respectively.

As shown in FIG. 4B, the piezoelectric element 61 formed on the vibrating arm 11 is provided on one side of the opposing surfaces (the surface perpendicular to the Z direction) defining the thickness of the vibrating arm 11. The piezoelectric element 61 is formed by a laminate made up of a lower electrode 21, a piezoelectric film 31, and an upper electrode 41. Although not shown in the drawing, an insulating film may be formed between the piezoelectric film 31 and the upper electrode 41.

In this way, the lower electrode 21 and the upper electrode 41 serving as an excitation electrode face each other with the piezoelectric film 31 interposed therebetween, whereby the piezoelectric element 61 is formed. Thus, the piezoelectric film 31 is able to contract or expand when a positive or negative voltage is applied between the electrodes. Moreover, the vibrating arm 11 can be displaced in the Z direction when the piezoelectric film 31 contracts or expands.

Similarly, the piezoelectric elements 62 and 63 formed on the vibrating arms 12 and 13, respectively are formed as laminates which are formed on one side of the opposing surfaces defining the thickness of the vibrating arm 11 and which are respectively made up of lower electrodes 22 and 23, piezoelectric films 32 and 33, and upper electrodes 42 and 43.

Moreover, the lower electrodes 21, 22, and 23 and the upper electrodes 41, 42, and 43 serving as the excitation electrode are formed so as to extend from the base portion 15 to a length about ½ L of the entire length L of the vibrating arm 11.

This is because when an excitation electrode having a length shorter than ½ of the entire length of the vibrating arm is used, although the CI value of the resonator element increases, and it is thus difficult to obtain sufficient vibration properties, by securing the lower electrode, piezoelectric film, and upper electrode having a length of at least ½ of the length of the vibrating arm, the CI value can be maintained to be low enough for oscillation of the resonator element. Thus, it is possible to obtain practically sufficient vibration properties.

The lower electrodes 21, 22, and 23 and the upper electrodes 41, 42, and 43 are extracted to the base portion 15 of the resonator element 1 and connected to mount electrodes 45 and 46 whose electrical conduction is attained by being fixed to a base of a container or the like. Moreover, a connection portion 47 is provided so as to connect the lower electrodes 21 and 23 and the upper electrode 42 together, and a connection portion 48 is provided so as to connect the lower electrode 22 and the upper electrodes 41 and 43 together. As a result, the polarity of the piezoelectric elements 61 and 63 is reversed from the polarity of the piezoelectric element 62.

As shown in FIG. 4C, a first mass portion 51 is provided on the same surface as the surface where the piezoelectric element 61 of the vibrating arm 11 is formed. The mass portion 51 is formed from a $SiO_2$ film, and the frequency of the vibrating arm 11 is adjusted by removing a part of the $SiO_2$ film.

The metal film or insulating film used herein as the first mass portion 51 may have a density D (in units of $10^3$ kg/m$^3$) which is in the range of $2.20 \leq D \leq 8.92$ as shown in FIG. 3. The metal film or insulating film whose density is in this range is a metal film or insulating film whose boundary at which the direction of the change in the frequency changes is located closer to the tip end side than the center of the vibrating arm 11. Therefore, the boundary at which the direction of the change in the frequency changes is present in the first mass portion 51.

Moreover, the material of the first mass portion 51 is selected, for example, from among $SiO_2$, Al, $Al_2O_3$, $TiO_2$, Cr, Fe, Ni, Cu, and the like.

First mass portions 52 and 53 having the same configuration as that of the vibrating arm 11 are also provided to the vibrating arms 12 and 13.

Furthermore, as shown in FIG. 4A, second mass portions 55, 56, and 57 for rough tuning are provided at the tip ends of the vibrating arms 11, 12, and 13, respectively, on the same surface as the surface where the first mass portions 51, 52, and 53 are formed. The second mass portions 55, 56, and 57 for rough tuning are formed from a gold (Au) film. As the metal film for rough tuning, a material whose density D (in units of $10^3$ kg/m$^3$) is in the range of D>8.92 is preferably used, and the examples thereof include Au, Ag, and Pt. As shown in FIG. 2, the use of an Au film in the tip end of the vibrating arm is optimal as a frequency adjustment film for rough tuning of a resonator element in which the amount of adjustment is large and whose variation of the frequencies with the removal is large.

As described above, the tip ends of the vibrating arms 11, 12, and 13 are used as the second mass portions for rough tuning which are made from a material whose density D (in units of $10^3$ kg/m$^3$) is in the range of D>8.92, and the central portions of the vibrating arms are used as the first mass portions for fine tuning which are made from a material whose density D (in units of $10^3$ kg/m$^3$) is in the range of $2.20 \leq D \leq 8.92$. Therefore, it is possible to form the excitation electrode so as to extend from the base-side end to the position near the center (½ L) of the vibrating arm. Accordingly, it is possible to prevent deterioration of the CI value and effectively perform the frequency adjustment of the resonator element 1 in a short period of time.

When the amount of adjustment of the resonator element 1 is small, the second mass portions 55, 56, and 57 for rough tuning are not essential, and the frequency adjustment is possible simply with the first mass portions 51, 52, and 53. Moreover, the second mass portions 55, 56, and 57 for rough tuning may be made from a material satisfying the relation of $2.20 \leq D \leq 8.92$ such as $SiO_2$, Al, $Al_2O_3$, $TiO_2$, Cr, Fe, Ni, or Cu.

As for the lower electrode and the upper electrode, a metal material such as gold (Au), aluminum (Al), or titanium (Ti) may be used. Moreover, in order to improve adhesion strength of the lower electrode and upper electrode to a base film, a chromium (Cr) film may be provided between each electrode and the base film. As for the piezoelectric film, a material such as ZnO, AlN, PZT, $LiNbO_3$, or $KNbO_3$ may be used, and particularly, ZnO and AlN are more preferable since superior properties can be obtained. As the insulating film, $SiO_2$, SiN, and the like are used.

The resonator element 1 is formed using a base material made from quartz, silicon, or the like. When quartz is used as the base material of the resonator element 1, an X-cut plate, an AT-cut plate, a Z-cut plate, or the like can be used.

In addition, in the above-described embodiment, although the first mass portions 51, 52, and 53 and the second mass portions 55, 56, and 57 for rough tuning are formed on the first surface side of the vibrating arm, the invention is not limited to this. The first and second mass portions may be formed on the second surface side of the vibrating arm and may be formed on both the first and second surface sides of the vibrating arm.

Next, an example of a frequency adjustment method in the resonator element having such a configuration will be described.

Figure 5A:
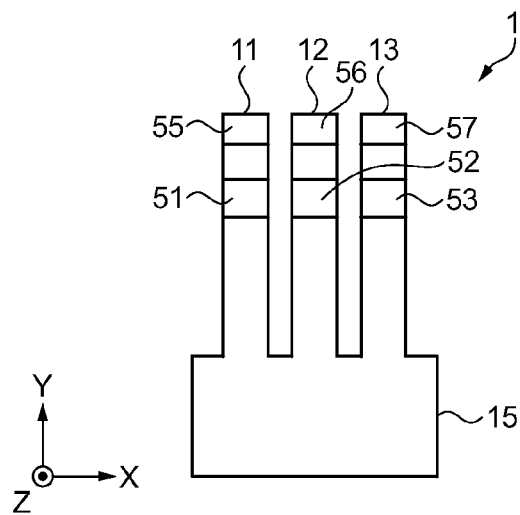
FIGS. 5A to 5C are schematic views illustrating the order of frequency adjustment in the resonator element of the first embodiment.
Figure 5B:
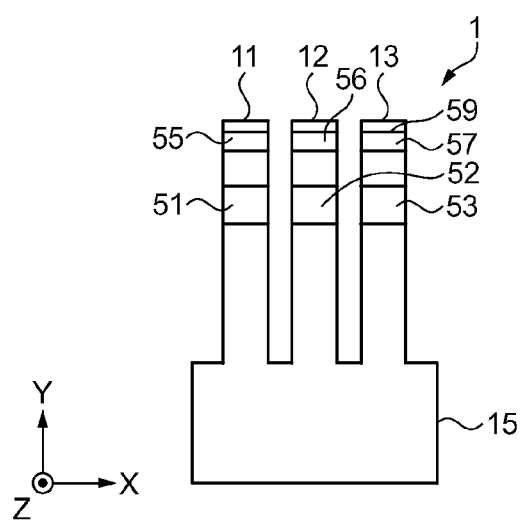
Figure 5C:
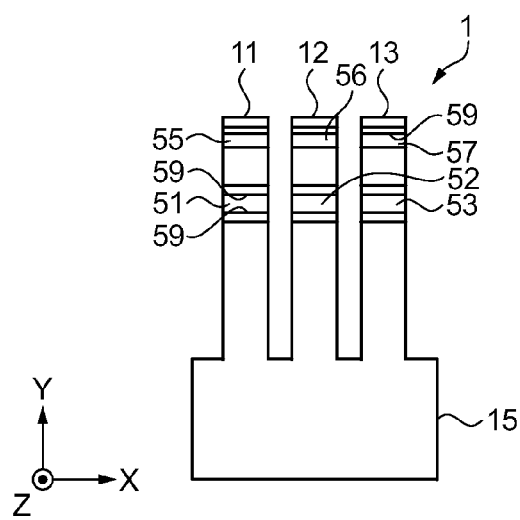

FIGS. 5A to 5C are schematic views illustrating the order of frequency adjustment in a resonator element. In the drawing, the piezoelectric elements, wirings, and the like are not illustrated.

As shown in FIG. 5A, the second mass portion for rough tuning and the first mass portion for fine tuning are formed on each of the vibrating arms 11, 12, and 13 of the resonator element 1. The second mass portions 55, 56, and 57 for rough tuning are disposed on the tip end sides of the vibrating arms 11, 12, and 13, and the first mass portions 51, 52, and 53 for fine tuning are disposed between the central portions of the vibrating arms 11, 12, and 13 and the tip ends thereof.

Before the adjustment, the frequency of the resonator element 1 is set to be lower than a target frequency.

First, as shown in FIG. 5B, the metal films of the second mass portions 55, 56, and 57 for rough tuning of the vibrating arms 11, 12, and 13 are irradiated with laser light so as to remove a part of each metal film.

The laser light is continuously irradiated in the X direction so as to cross the vibrating arms 11, 12, and 13. In this way, the second mass portions are removed in a linear form, and a laser processed line 59 is formed on the second mass portions 55, 56, and 57 for rough tuning. The irradiation of laser light is repeated until the frequency of the resonator element 1 falls within a desired frequency range. In this way, the mass of the second mass portions is adjusted so as to decrease with the removal of the mass portion formed from the metal film or insulating film, and the frequency of the resonator element 1 is adjusted so as to increase. Moreover, the frequency after the rough tuning is set to be lower than a target frequency.

Subsequently, when rough tuning of the resonator element 1 is completed, as shown in FIG. 5C, the metal films of the first mass portions 51, 52, and 53 for fine tuning of the vibrating arms 11, 12, and 13 are irradiated with laser light so as to remove a part of each metal film.

The irradiation of laser light is performed from the tip end sides of the first mass portions 51, 52, and 53 opposite to the base portion 15. This is because the weight effect is dominant on the tip end sides of the first mass portions 51, 52, and 53 opposite to the base portion 15, and the mass of the first mass portions can be adjusted downwards and the frequency of the resonator element 1 can be adjusted in an increasing direction by removing the mass portion formed from the metal film or insulating film. Moreover, since the boundary at which the direction of the change in the frequency changes is present in the first mass portions 51, 52, and 53, minute frequency adjustment where the variation of the frequencies is small is possible near this boundary.

The laser light is continuously irradiated in the X direction so as to cross the vibrating arms 11, 12, and 13. In this way, the metal films are removed in a linear form, and a laser processed line 59 is formed on the first mass portions 51, 52, and 53 for fine tuning. The irradiation of laser light is repeatedly performed so as to be shifted sequentially towards the base portion 15 and ends when the frequency of the resonator element 1 reaches a target frequency.

Here, although the frequency is adjusted so as to increase by irradiating the first mass portions 51, 52, and 53 with laser light, there is a case where the mass portions are removed too much, so that the frequency becomes higher than a target frequency. In that case, portions of the first mass portions 51, 52, and 53 close to the base portion 15 are irradiated with laser light to perform frequency adjustment. This is because the thickness effect is dominant on the portions of the first mass portions 51, 52, and 53 close to the base portion 15, and the mass of the first mass portions can be adjusted downwards and the frequency of the resonator element 1 can be adjusted in a decreasing direction by removing the first mass portions formed from the metal film or insulating film.

In this way, since the frequency of the resonator element 1 can be adjusted in a decreasing direction as well as an increasing direction, even where there is an error in the amount of frequency adjustment, the frequency can be adjusted with high accuracy.

As another frequency adjustment method, frequency adjustment is performed with the second mass portions 55, 56, and 57 for rough tuning so as to achieve a target frequency, and thereupon, frequency adjustment is performed with the first mass portions 51, 52, and 53 for fine tuning. In the fine tuning, it is determined whether the frequency of the resonator element 1 is higher or lower than the target frequency. If the frequency is lower than the target frequency, the metal films or insulating films of the first mass portions 51, 52, and 53 on the tip end side opposite to the base portion 15 are removed. If the frequency is higher than the target frequency, the metal films or insulating films of the first mass portions 51, 52, and 53 close to the base portion 15 are removed. With such a method, the frequency adjustment of the resonator element 1 can be performed.

Although the metal film or insulating film of the first mass portion was removed in a linear form, the film may be removed in the form of dots with an interval.

Moreover, when the resonator element 1 is mounted on a container, since the frequency changes due to circuit capacitance or the like, it is preferable to perform frequency adjustment after the resonator element 1 is mounted on the container.

As described above, the resonator element 1 of the present embodiment is a resonator element that vibrates in the out-of-plane mode and has a configuration in which the first mass portions 51, 52, and 53 are disposed on the tip end sides of the vibrating arms 11, 12, and 13 while exceeding ½ of the entire length L of each of the vibrating arms 11, 12, and 13 from the base portion 15 and are formed from the metal film or insulating film whose density D (in units of $10^3$ kg/m$^3$) is in the range of $2.20 \leq D \leq 8.92$.

According to such a configuration, it is possible to secure an excitation electrode for exciting the vibrating arms 11, 12, and 13 of the resonator element 1 so as to have a length of ½ of the entire length of each of the vibrating arms 11, 12, and 13. Thus, it is possible to obtain sufficient vibration properties with a low CI value for practical oscillation.

Moreover, the density D (in units of $10^3$ kg/m$^3$) of the metal film or insulating film formed in the first mass portions 51, 52, and 53 is in the range of $2.20 \leq D \leq 8.92$. Therefore, when a film is formed on the plane of the vibrating arms 11, 12, and 13, the boundary at which the dominant effect of the film switches between the weight effect and the thickness effect can be formed at a position near the position exceeding ½ of the length of each of the vibrating arms 11, 12, and 13. At this position, the variation of the frequencies is small with respect to the removal or addition of the film. Thus, the portion at this position can be used for fine tuning of the frequency adjustment, and high-accuracy frequency adjustment can be performed.

Given the above, according to the present embodiment, it is possible to provide the resonator element 1 which enables high-accuracy frequency adjustment while ensuring the vibration properties of the resonator element 1.

In the present embodiment, although the method of removing the metal film or insulating film has been described, the frequency adjustment of the resonator element is possible by a method of adding the metal film or insulating film.

Modifications

Next, modifications of the configuration of the metal film or insulating film of the first mass portion according to the first embodiment will be described.

Figure 6A:
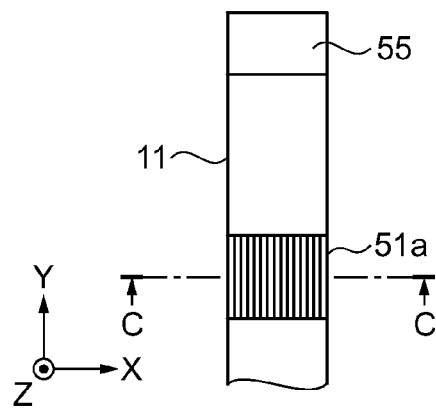
FIGS. 6A to 6F are views showing configurations of the first mass portion according to modifications.
Figure 6B:
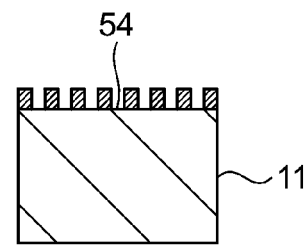
Figure 6C:
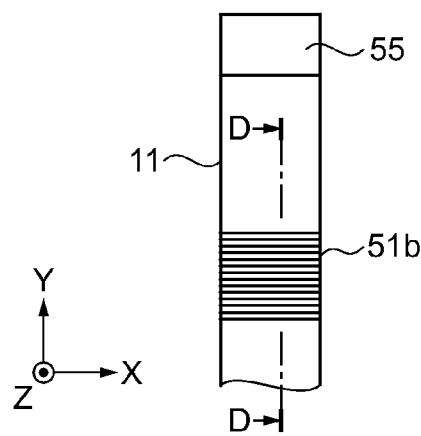
Figure 6D:
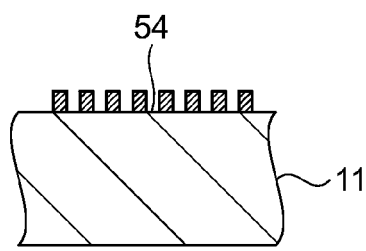
Figure 6E:
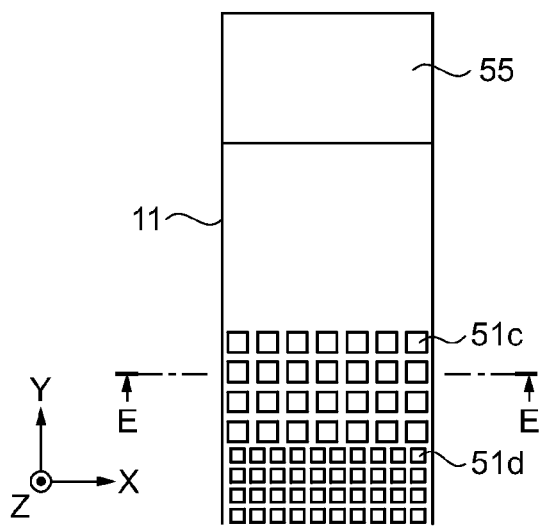
Figure 6F:
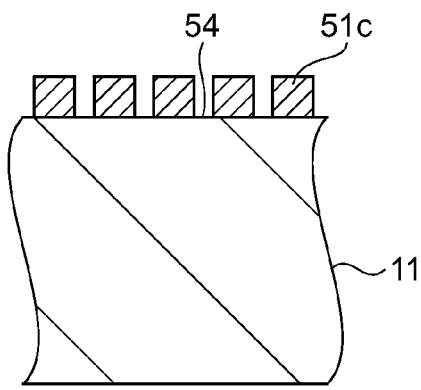

FIGS. 6A to 6F show configurations of the metal film or insulating film according to modifications of the first mass portion. Specifically, FIG. 6A is a top view showing a first modification, and FIG. 6B is a sectional view taken along the line C-C in FIG. 6A. Moreover, FIG. 6C is a top view showing a second modification, and FIG. 6D is a sectional view taken along the line D-D in FIG. 6C. Furthermore, FIG. 6E is a top view showing a third modification, and FIG. 6F is a sectional view taken along the line E-E in FIG. 6E. Although one vibrating arm is shown in FIGS. 6A to 6F, the other two vibrating arms have the same configuration.

As the first modification, as shown in FIGS. 6A and 6B, a first mass portion 51a is formed in an intermediate portion of the vibrating arm 11, and a number of grooves 54 are formed as slits on the metal film or insulating film of the first mass portion 51a so as to extend in the extension direction (Y direction) of the vibrating arm 11.

As the second modification, as shown in FIGS. 6C and 6D, a first mass portion 51b is formed in an intermediate portion of the vibrating arm 11, and a number of grooves 54 are formed as slits on the metal film or insulating film of the first mass portion 51b so as to extend in the width direction (X direction) of the vibrating arm 11.

Since the first mass portion 51a or 51b is formed as slits, the variation in the frequencies is small with respect to the removal of the same area of the metal film or insulating film, and thus high-accuracy fine tuning is possible.

The formation direction of the slits is not limited to the above, and oblique slits are also possible.

As the third modification, as shown in FIGS. 6E and 6F, first mass portions 51c and 51d may be formed near the center of the vibrating arm 11, and the metal film or insulating film of the first mass portions 51c and 51d may be formed as a number of blocks arranged in the width direction (X direction) and the length direction (Y direction) of the vibrating arm 11. By forming the first mass portions 51d so as to be smaller than the first mass portions 51c as shown in the drawings, an arbitrary mass portion can be selected in accordance with the amount of frequency adjustment.

Second Embodiment

Next, a resonator having the above-described resonator element will be described as a second embodiment.

Figure 7A:
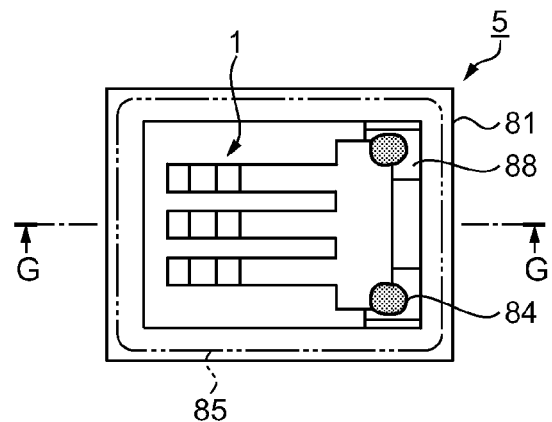
Figure 7B:
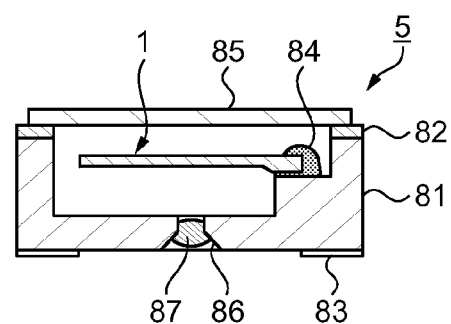

FIGS. 7A and 7B show a configuration of a resonator, in which FIG. 7A is a schematic top view, and FIG. 7B is a schematic sectional view taken along the line G-G in FIG. 7A.

A resonator 5 includes the resonator element 1 according to the first embodiment, a ceramic package 81 serving as a container, and a cover 85.

The ceramic package 81 has a recess portion which is formed so as to accommodate the resonator element 1, and connection pads 88 connected to the mount electrodes of the resonator element 1 are formed in the recess portion. The connection pads 88 are connected to wirings in the ceramic package 81 so as to be conducted to external connection terminals 83 which are provided on the periphery of the ceramic package 81.

Moreover, a seam ring 82 is provided around the recess portion of the ceramic package 81. Furthermore, a penetration hole 86 is provided on the bottom portion of the ceramic package 81.

The resonator element 1 is attached and fixed to the connection pads 88 of the ceramic package 81 by a conductive adhesive agent 84, and the cover 85 covering the recess portion of the ceramic package 81 is seam-welded to the seam ring 82. The penetration hole 86 of the ceramic package 81 is filled with a metallic sealing material 87. The sealing material 87 is melted in a depressurized atmosphere and is hermetically sealed so that the inside of the ceramic package 81 is in the depressurized state.

Given the above, since the resonator 5 includes the resonator element 1 which enables high-accuracy frequency adjustment while providing favorable vibration properties, it is possible to provide the resonator 5 having excellent frequency accuracy.

Third Embodiment

Next, an oscillator having the above-described resonator element will be described as a third embodiment.

Figure 8A:
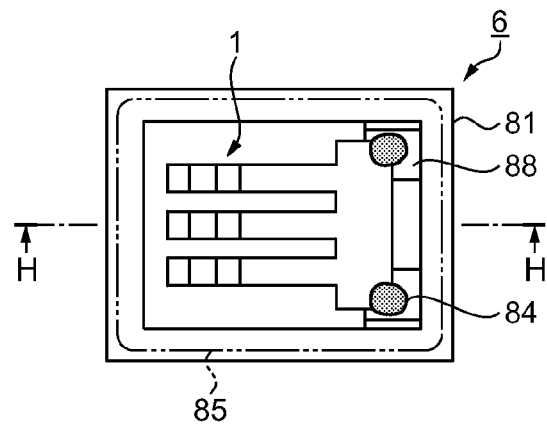
Figure 8B:
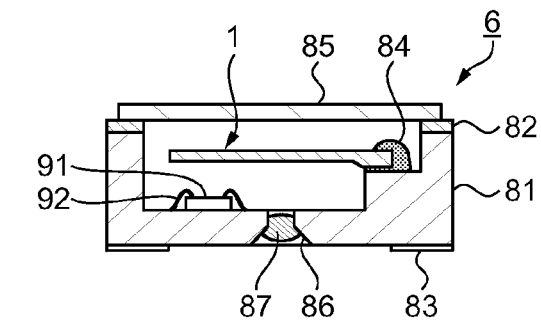

FIGS. 8A and 8B show a configuration of an oscillator, in which FIG. 8A is a schematic top view, and FIG. 8B is a schematic sectional view taken along the line H-H in FIG. 8A.

An oscillator 6 is different from the resonator 5 described above in that it further includes an IC chip as a circuit element. Therefore, the same constituent elements as those of the resonator 5 will be denoted by the same reference numerals, and description thereof will be omitted.

The oscillator 6 includes the resonator element 1 according to the first embodiment, the ceramic package 81 serving as a container, the cover 85, and an IC chip 91 serving as a circuit element.

The IC chip 91 includes an oscillation circuit that excites the resonator element 1, and is fixed to the bottom portion of the ceramic package 81 and connected to other wirings by metal wires 92 such as gold wires.

Give the above, since the oscillator 6 includes the resonator element 1 which enables high-accuracy frequency adjustment while providing favorable vibration properties, it is possible to provide the oscillator 6 having excellent frequency accuracy.

Fourth Embodiment

Next, an electronic device using the above-described resonator element will be described as a fourth embodiment. However, the electronic device is not illustrated.

The above-described resonator element 1 can be preferably used, for example, as a reference clock generation source for various electronic devices such as portable telephones, electronic books, personal computers, televisions, digital still cameras, video cameras, video tape recorders, car navigation systems, pagers, electronic organizers, electronic calculators, word processors, workstations, video phones, POS terminals, and apparatuses equipped with touch panels. In any of the cases, an electronic device exhibiting the same advantages as described in the respective embodiments and modifications can be provided.

The entire disclosure of Japanese Patent Application No. 2009-299050, filed Dec. 29, 2009 and No. 2010-180101, filed Aug. 11, 2010 are expressly incorporated by reference herein.

What is claimed is:

1. A resonator element comprising:
a base portion provided on a plane including a first axis and a second axis orthogonal to the first axis;
a vibrating arm extending from the base portion in the first axis direction, the vibrating arm including a terminal end disposed opposite the base portion;
an excitation electrode provided on the vibrating arm so as to excite the vibrating arm; and
a first mass portion provided on the vibrating arm so as to adjust the frequency of the vibrating arm, the first mass portion being provided at a location spaced apart from the terminal end of the vibrating arm in the first axis direction,
wherein the vibrating arm performs flexural vibration in a direction perpendicular to the plane and has a first surface which contracts or expands with the flexural vibration and a second surface which expands when the first surface contracts and contracts when the first surface expands,
wherein the first mass portion is provided on the first surface, and
wherein the location of the excitation electrode is provided only in a region of the vibrating arm located at a distance less than or equal to ½ of an entire length of the vibration arm in the first axis direction from an end of the vibrating arm proximate the base portion, and the location of the first mass portion is provided in a region of the vibrating arm located at a distance greater than ½ of the entire length of the vibration arm in the first axis direction from the end of the vibrating arm proximate the base portion, and is formed from a material having a density D (in units of $10^3$ kg/m$^3$) that is in the range of $2.20 \leq D \leq 8.92$.

2. The resonator element according to claim 1, wherein the first mass portion is formed from a material selected from among $SiO_2$, Al, $Al_2O_3$, $TiO_2$, Cr, Fe, Ni, and Cu.

3. The resonator element according to claim 1, further comprising a second mass portion provided at a terminal end of the vibrating arm, wherein the second mass portion has a density D (in units of $10^3$ kg/m$^3$) that is in the range of $D>8.92$.

4. The resonator element according to claim 3, wherein the second mass portion is formed from a material selected from among Ag, Au, and Pt.

5. A resonator comprising:
the resonator element according to claim 1; and
a package accommodating the resonator element.

6. An oscillator comprising:
the resonator element according to claim 1; and
a circuit element connected to the resonator element.

7. An electronic device using the resonator element according to claim 1.

8. A frequency adjustment method comprising:
preparing a resonator element including:
a base portion provided on a plane including a first axis and a second axis orthogonal to the first axis,
a vibrating arm extending from the base portion in the first axis direction, the vibrating arm including a terminal end disposed opposite the base portion,
an excitation electrode provided on the vibrating arm so as to excite the vibrating arm, and
a first mass portion provided on the vibrating arm so as to adjust the frequency of the vibrating arm, the first mass portion being provided at a location spaced apart from the terminal end of the vibrating arm in the first axis direction,
wherein the vibrating arm performs flexural vibration in a direction perpendicular to the plane and has a first surface which contracts or expands with the flexural vibration and a second surface which expands when the first surface contracts and contracts when the first surface expands,
wherein the first mass portion is provided on the first surface; and
adjusting the frequency of the vibrating arm by changing the mass of the first mass portion,
wherein the location of the excitation electrode is provided only in a region of the vibrating arm located at a distance less than or equal to ½ of an entire length of the vibration arm in the first axis direction from an end of the vibrating arm proximate the base portion, and the location of the first mass portion is provided in a region of the vibrating arm located at a distance greater than ½ of the entire length of the vibration arm in the first axis direction from the end of the vibrating arm proximate the base portion, and is formed from a material having a density D (in units of $10^3$ kg/m$^3$) that is in the range of $2.20 \leq D \leq 8.92$.

9. The frequency adjustment method according to claim 8, wherein a second mass portion whose density D2 (in units of $10^3$ kg/m$^3$) is in the range of $D2>8.92$ is provided at the terminal end of the vibrating arm,
wherein the method includes rough-tuning the frequency of the vibrating arm by changing the mass of the second mass portion, and
wherein the frequency is finely tuned after the rough tuning is performed.

10. The resonator element of claim 1, wherein the excitation electrode is only provided on the first surface of the vibrating arm.

11. The resonator element of claim 3, wherein the second mass portion is spaced apart from the first mass portion such that the second mass portion does not overlap the first mass portion.

12. The frequency adjustment method of claim 8, wherein the excitation electrode is only provided on the upper surface of the vibrating arm.

13. The frequency adjustment method of claim 9, wherein the second mass portion is spaced apart from the first mass portion such that the second mass portion does not overlap the first mass portion.

14. The frequency adjustment method of claim 8, wherein a plurality of grooves are formed in the first mass portion that extend in a width direction of the vibrating arm.

15. The frequency adjustment method of claim 8, wherein a plurality of grooves are formed in the first mass portion that extend in a length direction of the vibrating arm.

16. The frequency adjustment method of claim 8, wherein a plurality of grooves are formed in the first mass portion that extend in a width direction of the vibrating arm, and a plurality of grooves are formed in the first mass portion that extend in a length direction of the vibrating arm.

17. The resonator element of claim 1, wherein a plurality of grooves are formed in the first mass portion that extend in a width direction of the vibrating arm.

18. The resonator element of claim 1, wherein a plurality of grooves are formed in the first mass portion that extend in a length direction of the vibrating arm.

19. The resonator element of claim 1, wherein a plurality of grooves are formed in the first mass portion that extend in a width direction of the vibrating arm, and a plurality of grooves are formed in the first mass portion that extend in a length direction of the vibrating arm.

* * * * *